United States Patent [19]

Kim

[11] Patent Number: 5,786,723

[45] Date of Patent: Jul. 28, 1998

[54] VOLTAGE SWITCHING CIRCUIT FOR A SEMICONDUCTOR MEMORY DEVICE

[75] Inventor: Jong-Sun Kim, Seoul, Rep. of Korea

[73] Assignee: Samsung Electronics, Co, Ltd., Suwon, Rep. of Korea

[21] Appl. No.: 674,319

[22] Filed: Jul. 1, 1996

[30] Foreign Application Priority Data

Jun. 30, 1995 [KR] Rep. of Korea ............... 1995/18976

[51] Int. Cl.[6] .................................................. G05F 1/10
[52] U.S. Cl. .................. 327/530; 327/54; 327/333; 327/215
[58] Field of Search ............................ 327/54, 55, 57, 327/215, 219, 223, 225, 333

[56] References Cited

U.S. PATENT DOCUMENTS

| | | | |
|---|---|---|---|
| 5,021,686 | 6/1991 | Kawata et al. | 327/215 |
| 5,559,996 | 9/1996 | Fujioka | 327/333 |
| 5,594,695 | 1/1997 | Yim et al. | 327/54 |

*Primary Examiner*—David C. Nelms
*Assistant Examiner*—Michael T. Tran
*Attorney, Agent, or Firm*—Marger, Johnson, McCollom, and Stolowitz P.C.

[57] ABSTRACT

The present invention comprises a cascode circuit of the type having a first and second FET in a first leg and a third and fourth FET in a second leg comprising. The first and third FETs are switched between an on state and an off state substantially in tandem in response to a level change in an input signal to the cascode circuit. The second and fourth FETs are switched between an on state and an off state substantially in tandem in response to a level change in the input signal and substantially complimentary to the switching of said first and third FETS. A biasing signal is applied to a control electrode of the first FET responsive to transition of the input signal from a first level to a second level. A biasing signal is also applied to a control electrode of the third FET responsive to transition of the input signal from the second level to the first level.

5 Claims, 3 Drawing Sheets

5,786,723

1

VOLTAGE SWITCHING CIRCUIT FOR A SEMICONDUCTOR MEMORY DEVICE

BACKGROUND OF THE INVENTION

1. Field of the Invention

The present invention relates to a voltage switching circuit for a semiconductor memory device and more particularly to a cascode voltage switching circuit.

The present application for a voltage switching circuit for a semiconductor memory device is based on Korean Application No. 1995/18976 which is incorporated herein by reference for all purposes.

2. Description of the Related Art

Highly integrated semiconductor memory devices require operating supply voltages of different levels. To achieve this end, a voltage switching circuit for dropping an external supply voltage outside of a semiconductor chip to an internal supply voltage level is often provided in memory devices. As the operating supply for semiconductor memory supplies has dropped, the need for supplying precise voltage levels has increased.

Recent semiconductor memory devices made with high integration technology, however, do not always require a low-level supply voltage but need an increased voltage level and a negative voltage level, as circumstances require. Accordingly, a voltage switching circuit and a negative-voltage generator that can transform voltage are employed in such chips. A conventional cascode voltage switch logical circuit (CVSL) produces an output signal having an amplitude that is increased at an output node in response to a supply voltage level input signal.

FIG. 1 is a circuit diagram of a conventional cascode voltage switch logical circuit.

Referring to FIG. 1, a signal input terminal IN is connected to a gate terminal of an N-type metal-oxide-semiconductor (NMOS) transistor 10 and to an input terminal of an invertor 25. The input terminal of the invertor 25 is connected to a gate terminal of an NMOS transistor 20. The NMOS transistors 10 and 20 each have source terminals connected to ground Vss and drain terminals connected to drain terminals of P-type metal-oxide-semiconductor (PMOS) transistors 5 and 15, respectively.

The respective PMOS transistors 5 and 15 have source terminals connected to a step-up voltage terminal Vpp. The PMOS transistors 5 and 15 also have gate terminals respectively connected to control nodes N2 and N1, which are in common with the drain terminals of the PMOS transistors 15 and 5, respectively. The control node N2 is in common with an output node OUT.

The following describes the operation of the conventional cascode voltage switch logical circuit. When the input signal at terminal IN changes its logic state from "low" to "high", the NMOS transistor 10 turns on and NMOS transistor 20 turns off. Accordingly, voltage at control node N1 is discharged via transistor 10 to attain a logic "low" state and control node N2 attains a logic "high" state. The PMOS transistors 15 and 5 are respectively turned on and off by the change in the state of each control node N1 and N2. Therefore, when the logic "low" state of the input signal IN is converted to the logic "high" state, the output voltage has the same value as that of the step-up voltage terminal Vpp.

When the input signal at terminal IN changes its logic state from "high" to "low", NMOS transistor 10 turns off and NMOS transistor 20 turns on. Accordingly, the control node Ni is charged to attain a logic "high" state and the control node N2 discharges to a logic "low" state. The PMOS transistors 15 and 5 are respectively turned off and turned on by the change in the level of each control node N1 and N2. Therefore, when the logic "high" state of the input signal IN changes to the logic "low" state, the output voltage, hereinafter referred to as OUT, at terminal OUT has a value of zero.

When the input signal, hereinafter referred to as IN, at terminal IN first changes its logic state to "high" from "low", the control node N2 is still at substantially Vss, which is under the level of |Vpp–Vtp|, the potential required at node N2 to turn transistor 5 off. It takes a relatively long time to charge node N2 to the level of |Vpp–Vtp|. While node N2 charges, there is a direct-current path between the ground Vss and step-up voltage terminal Vpp by way of the PMOS transistor 5 and the NMOS transistor 10, which gives rise to a sudden, heavy flow of current.

The time for node N2 to charge to a level sufficient to turn off transistor 5 is relatively long due to, at least in part, the coupling effect between node N1 and the gate of transistor 5. When the control node N1 goes to a logic "low" level, as a result of IN going to a "high" level, the gate voltage of the PMOS transistor 5 drops responsive to the coupling effect thereby increasing the gate-source voltage |vgs| of the PMOS transistor 5. Hence, the PMOS transistor 5 is turned on very vigorously thus causing a flow of overcurrent. This tends to deteriorate the driving capability of transistor 5.

When the input signal IN changes its logic state to "low" from "high", control node N1 changes from a "low" level to a "high" level. PMOS transistor 15 remains on, however, until node Ni can charge over the level of |Vpp–Vtp|. Because the NMOS transistor 20 turns on fairly rapidly responsive to the logic "low" state of the input signal IN, voltage of the control node N2 is discharged to a logic "low" state whereby the PMOS transistor 5 turns on. During the time that node N1 charges to a level sufficient to turn off PMOS transistor 15, transistor 15 and NMOS transistor 20 are turned on thereby providing a direct-current path between the step-up voltage terminal Vpp and ground Vss. This produces a sudden, heavy flow of current. When the control node N2 attains a logic "low" level, the gate voltage of the PMOS transistor 15 drops to a lower voltage level, possibly even below Vss, as a result of the coupling effect. The gate-source voltage |vgs| of the PMOS transistor 15 becomes larger thus turning on the PMOS transistor 15 hard and causing a flow of overcurrent. This deteriorates the driving capability of transistor 15.

SUMMARY OF THE INVENTION

It is an object of the present invention to provide a voltage switching circuit for a semiconductor memory device that ensures a reduction in the power consumption by precluding a transient direct-current path.

It is another object of the present invention to provide a voltage switching circuit for a semiconductor memory device that can prevent a decrease in gate voltage of transistors and generation of overcurrent and enhance their driving capability to ensure a high speed voltage switching operation.

In order to realize the above objects, the present invention provides, in one aspect, a circuit for switching between a first output voltage level responsive to a first input signal level and a second output voltage level responsive to a second input signal level. A first transistor has a first terminal connected to a voltage source. A second transistor has one terminal connected to a second terminal of the first transistor, one terminal connected to a reference potential, and a control electrode connected to an input signal terminal. An invertor includes an input terminal connected to the input signal terminal. A third transistor has a first terminal connected to the voltage source, a second terminal connected to a control electrode of the first transistor, and a control electrode connected to the second terminal of said first transistor. A fourth transistor includes a first terminal connected to the second terminal of the third transistor, a second terminal connected to the reference potential, and a control electrode connected to an output terminal of said invertor.

A first controller is connected to the control electrode of the first transistor. The controller drives the first transistor between a turned-on state and a turned-off state responsive to changes in said input signal level. A second controller is connected to the control electrode of the third transistor. The second controller drives the third transistor between a turned-on state and a turned-off state responsive to changes in said input signal level.

In another aspect, a method for biasing a cascode circuit is provided in which biasing signals are separately provided to the control electrodes of the first and third transistors responsive to changes in the input signal level.

DETAILED DESCRIPTION OF THE PREFERRED EMBODIMENT

Figure 1:
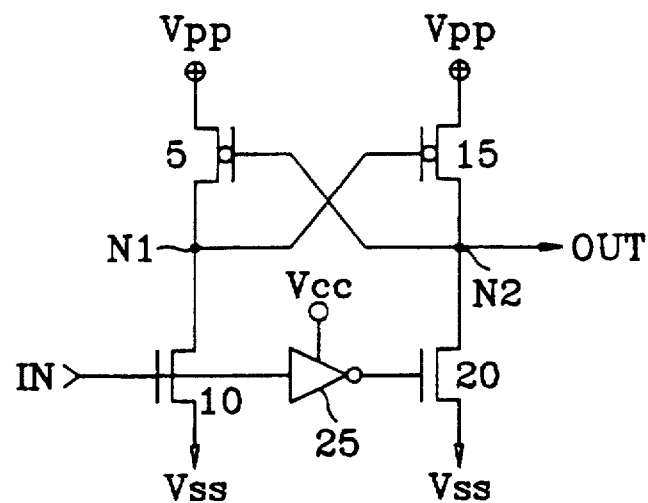
FIG. 1 is a schematic circuit diagram of a conventional voltage switching circuit for a semiconductor memory device.

A preferred embodiment of the present invention is now described in detail with reference to the accompanying drawings. Similar reference numerals denote similar parts throughout the specification and drawings.

Figure 2:
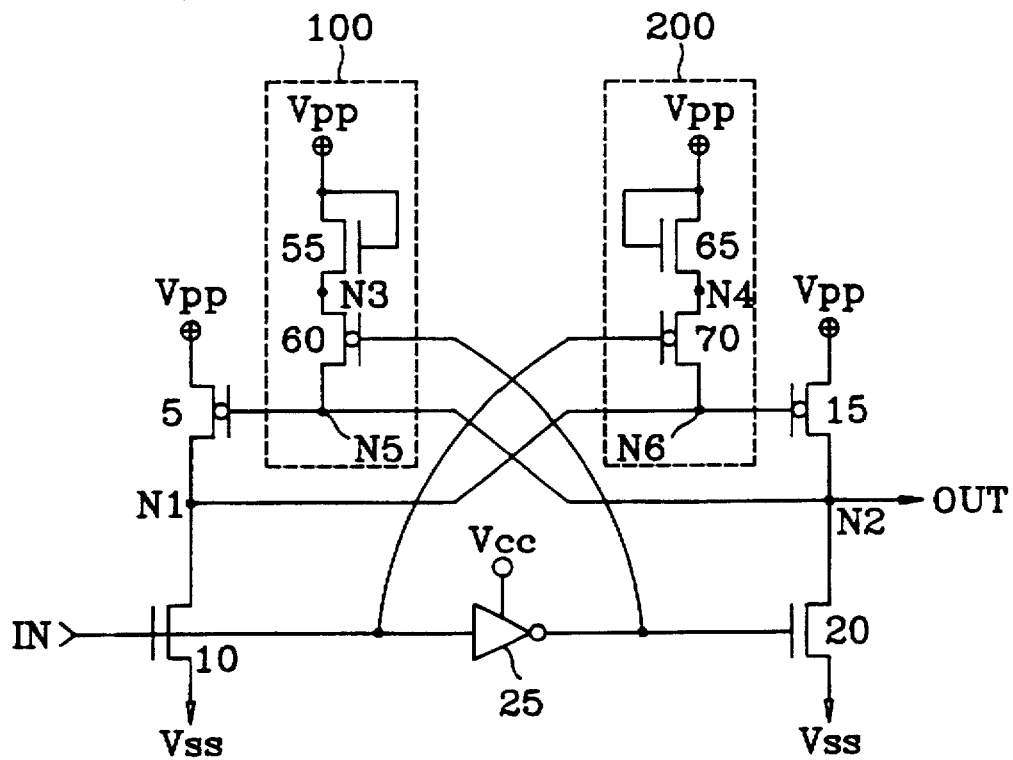
FIG. 2 is a schematic circuit diagram of a voltage switching circuit for a semiconductor memory device in accordance with the present invention.

FIG. 2 is a circuit diagram of a voltage switching circuit for a semiconductor memory device in accordance with the present invention.

As shown in FIG. 2, a signal input terminal IN is coupled to a gate terminal of an NMOS transistor 10 and to an input terminal of an invertor 25. The input signal attains a first voltage level, e.g., the level of the internal supply voltage.

An output terminal of the invertor 25 is connected to a gate terminal of an NMOS transistor 20. The NMOS transistors 10 and 20 have source terminals connected to ground Vss and to drain terminals of PMOS transistors 5 and 15, respectively.

The PMOS transistors 5 and 15 have source terminals connected to a voltage source, e.g., the step-up voltage source Vpp. The PMOS transistors 5 and 15 have gate terminals connected to control nodes N2 and N1 which are in common with the drain terminals of the PMOS transistors 15 and 5. The control node N2 is also connected in common to output terminal OUT. Node N5 is in common with the gate terminal of the PMOS transistor 5 and the control node N2. Node N5 is connected in series to a PMOS transistor 60 and an NMOS transistor 55, which in turn is connected to Vpp. Node N6 is in common with the gate terminal of the PMOS transistor 15 and the control node N1. Node N6 is connected in series to a PMOS transistor 70 and an NMOS transistor 65, which in turn is connected to Vpp.

The NMOS transistor 55 is connected to the step-up voltage terminal Vpp in diode configuration and also has a source terminal connected to a source terminal of the PMOS transistor 60. The PMOS transistor 60 has a drain terminal connected to the node N5 and also has a gate terminal connected to the output terminal of the invertor 25.

The NMOS transistor 65 is connected to the step-up voltage terminal Vpp in diode configuration and has a source terminal connected to a source terminal of the PMOS transistor 70. The PMOS transistor 70 has a drain terminal connected to the node N6 and a gate terminal connected to the input terminal of the invertor 25.

Consideration will first be given to one aspect of operation of the circuit in FIG. 2 as if the NMOS transistors 55 and 65 were not provided,i.e., if the sources of PMOS transistors 60, 70 were connected directly to Vpp. When the input signal IN attains a "high" level (supply voltage level of approximately 3.3 V), a gate of the PMOS transistor 70, forming a part of controlling unit 200, also attains a "high" level of about 3.3 V. Node N4, source terminal of the PMOS transistor 70, thus attains the step-up voltage level Vpp, i.e. 5 V. The gate-source voltage Vgs of transistor 70 is given by the following equation (recalling that transistor 65 is not considered):

$$Vgs = Vin - Vpp = 3.3 - 5.0 = 1.7 \; ; \; |Vgs| > |Vtp|$$

where |Vtp| is the threshold voltage of the PMOS transistor 70, which is about 1 volt.

The PMOS transistor 70 is thus turned on to cause a direct-current path between the step-up voltage terminal Vpp and ground Vss via the node N1 and NMOS transistor 10. To preclude such a direct-current path, and considering now the effect of transistors 55 and 65, as the voltage level of the node N4 lowers to the level of |Vpp − Vtn|, where Vtn is the threshold voltage of transistor 65, responsive to the input signal IN attaining a high level of Vcc, i.e., 3.3 V, the gate-source voltage of the PMOS transistor 70 is given by the following equation:

$$Vgs = Vin - (Vpp - Vtn) = 3.3 \; V - (5 \; V - 1.0 \; V) = -0.7 \; V;$$

$$|Vgs| < |Vtp|$$

When the voltage level of the node N4 lowers and the input signal IN attains a high level, the NMOS transistor 65 with diode configuration serves to turn off PMOS transistor 70. This circuit may be formed by more than one NMOS transistor each coupled in series, by a general junction diode, or a PMOS transistor with diode configuration in order to set the node N4 to a desired voltage level. In addition, the voltage level of each node N3 and N4 may be adjusted by diodes coupled in series so as to ensure the normal operation of the controlling units 100 and 200 at any step-up voltage level Vpp.

In the absence of NMOS transistor 55, when the input signal IN attains a low level, i.e., 0 volts, transistor 20 turns on, and the PMOS transistor 60 forming a part of the controlling unit 100 also turns on to cause a direct-current path between the step-up voltage terminal Vpp and ground Vss via the node N2. Such a direct-current path may be precluded by forming the NMOS transistor 55 between the step-up voltage terminal Vpp and node N3 as shown in the controlling unit 200.

Figure 3:
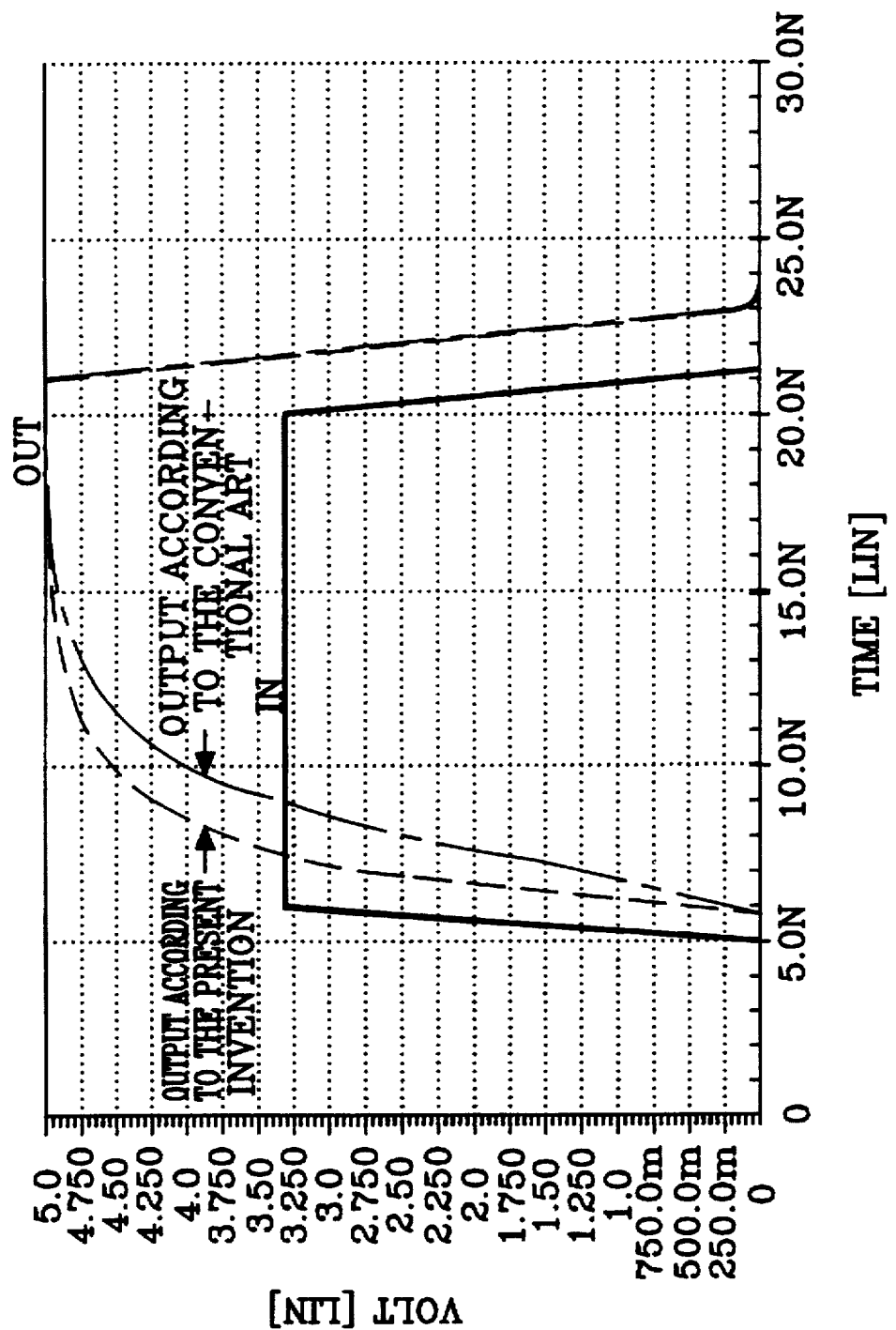
FIG. 3 depicts waveforms of output voltage of each circuit according to FIGS. 1 and 2.

When the circuit of FIG. 3 is in an inactive state, where the voltage switching circuit is not operated, both the nodes N3 and N4 attain the level of | Vpp − Vtnl.

When the input signal IN attaining a logic "high" state is applied to the input terminal of the invertor 25, the invertor input terminal is at a high level and its output terminal is at a low level. Accordingly, the NMOS transistors 10 and 20 are turned on and off, respectively. The PMOS transistors 60 and 70 whose gate terminals directly receive the input terminal and output terminal voltages of the invertor 25 are turned on and turned off, respectively. The node N5 attains the level of | Vpp − Vtnl and the node N6 attains a zero-voltage level. Accordingly, the transistors 5 and 15 are turned off and on at high speed. Also, voltage of the control node Ni is discharged at high speed and the control node N2 is charged at high speed, which minimizes the time the direct-current path exists between the step-up voltage terminal Vpp and ground Vss. The boosted voltage of Vpp level is thus provided at output OUT in a manner similar that of the circuit of FIG. 1.

When the input signal IN attains a logic "low" state, the input terminal of the invertor 25 is at a "low" state, and the output terminal of the invertor 25 is at a "high" state. Accordingly, the NMOS transistors 10 and 20 are turned off and on. The PMOS transistors 60 and 70, the gate terminals of which receive the input terminal and output terminal voltages of the invertor 25, are turned off and turned on, respectively. The node N5 attains a 0-voltage level and the node N6 attains the level of |Vpp − Vtnl. The control node N1 is thus charged at high speed and the voltage of the control node N2 is discharged at high speed, which minimizes the magnitude of direct current flowing in this circuit due to the direct-current path between the-step-up voltage terminal Vpp and ground Vss. A signal of 0-volts is thus produced through the output node.

FIG. 3 depicts waveforms of output voltage of each circuit according to FIGS. 1 and 2.

As shown in FIG. 3, it takes less time to produce the output OUT in response to the input IN, which results from the prompt sensing operation of the transistors 60 and 70 respectively coupled to the input and output terminals of the invertor 25. Such a high speed sensing operation of the transistors 60 and 70 enables the output signal to be produced faster.

Figure 4:
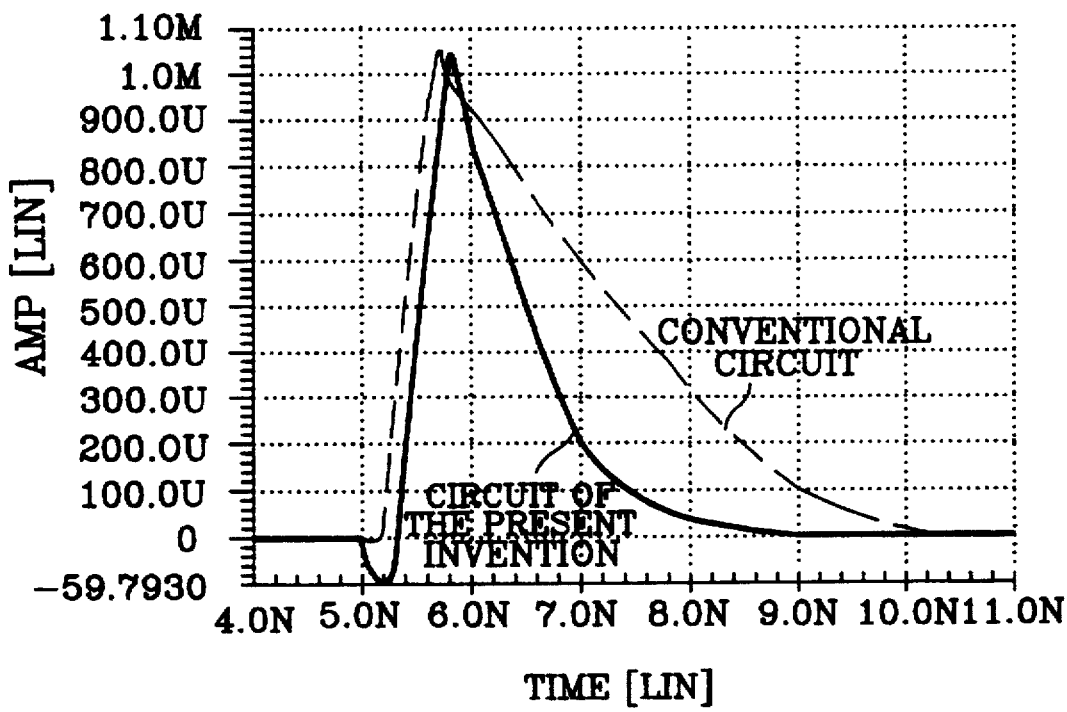
FIG. 4 depicts waveforms for showing the magnitude of current consumed when an input signal is converted to a logic "high" state from a logic "low" state.
Figure 5:
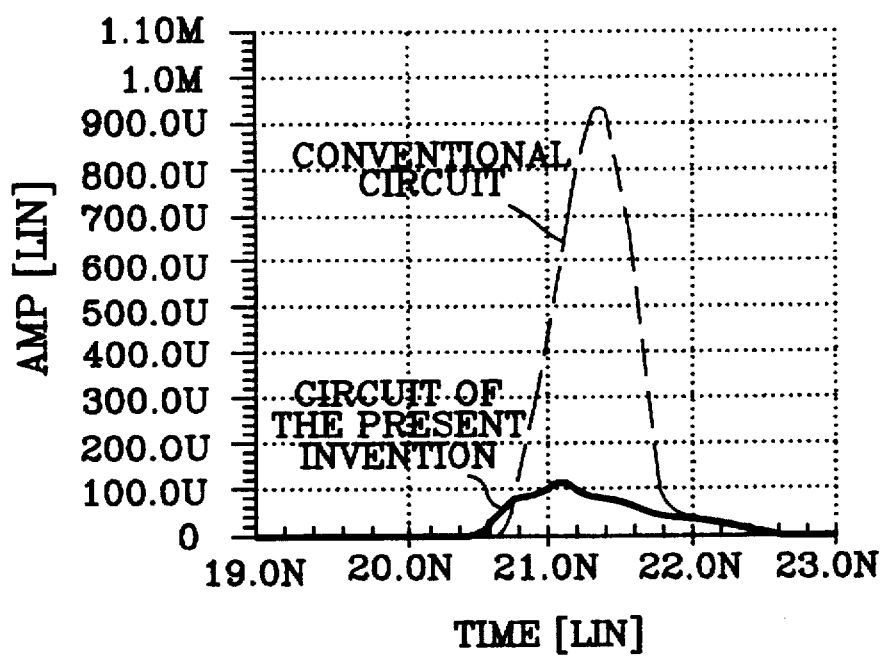
FIG. 5 depicts waveforms for showing the magnitude of current consumed when an input signal is converted to a logic "low" state from a logic "high" state.

FIG. 4 graphically shows the magnitude of current consumption when an input signal changes its logic state from "low" to "high" and FIG. 5 graphically shows the magnitude of current consumption when an input signal changes its logic state from "high" to "low".

As shown in FIG. 4, when the input signal changes its logic state from "low" to "high", there is a relatively small decrease in the magnitude of the current discharged to the ground from the step-up voltage terminal Vpp through the PMOS transistor 5. FIG. 5 shows clearly the advantage of the present invention. When the input signal changes its logic state from "high" to "low", there is a significant decrease in the magnitude of the current discharged to the ground from the step-up voltage terminal Vpp through the PMOS transistor 15.

Through the above procedure, the present invention provides a voltage switching circuit that can produce different output voltage levels responsive an input signal and reduce problems of noise and erroneous operation on account of an electric discharge by its output operation. Therefore, the voltage switching circuit of the present invention enhances the driving capability by providing high-speed response characteristics and minimizes the amount of direct current flowing in the circuit due to a direct-current path whereby a semiconductor memory device with low power consumption may be fabricated.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for biasing a cascode circuit of the type having a first and second FET in a first leg and a third and fourth FET in a second leg comprising:

switching said first and third FETs between an on state and an off state substantially in tandem in response to a level change in an input signal to said cascode circuit;

switching said second and fourth FETs between an on state and an off state substantially in tandem in response to a level change in said input signal and substantially complimentary to the switching of said first and third FETs;

applying a biasing signal to a control electrode of said first FET responsive to transition of said input signal from a first level to a second level; and applying a biasing signal to a control electrode of said third FET responsive to transition of said input signal from said second level to said first level.

2. The method of claim 1 wherein said method further comprises turning said first FET on when said signal is at said first level wherein applying a biasing signal to a control electrode of said first FET responsive to transition of said input signal from a first level to a second level comprises biasing said first FET to an off state.

3. The method of claim 1 wherein said method further comprises turning third FET on when said signal is at said second and level wherein applying a biasing signal to a control electrode of said third FET responsive to transition of said input signal from said second level to said first level comprises biasing said third FET to an off state.

4. The method of claim 1 wherein applying a biasing signal to a control electrode of said first FET responsive to transition of said input signal from a first level to a second level comprises:

inverting the input signal; and applying the inverted input signal to a control electrode of a fifth FET having one terminal connected to a control electrode of said first FET.

5. The method of claim 1 wherein applying a biasing signal to a control electrode of said third FET responsive to transition of said input signal from said second level to said first level comprises applying the input signal to a control electrode of a sixth FET having one terminal connected to a control electrode of said first FET.

* * * * *

UNITED STATES PATENT AND TRADEMARK OFFICE
CERTIFICATE OF CORRECTION

PATENT NO.    : 5,786,723
DATED         : July 28, 1998
INVENTOR(S)   : Kim

It is certified that error appears in the above-identified patent and that said Letters Patent is hereby corrected as shown below:

Column 1,
Line 67, "Ni" should read -- N1 --.

Column 2,
Line 13, "| Vpp-Vtp1" should read -- | Vpp-Vtp | --.
Line 32, "Ni" should read -- N1 --.

Column 4,
Line 34, "Vgs=Vin-Vpp=3.3=5.0=1.7" should read -- Vgs=Vin-Vpp=3.3-5.0=-1.7 --.
Line 43, "| Vpp-Vtn1" should read -- | Vpp-Vtn | --.
Line 50, "| Vgs1< | Vtp |" should read -- | Vgs | < | Vtp | --.

Column 5,
Line 18, "Ni" should read -- N1 --.

Signed and Sealed this

Sixteenth Day of July, 2002

*Attest:*

JAMES E. ROGAN
*Attesting Officer*   Director of the United States Patent and Trademark Office